United States Patent
Haase

(10) Patent No.: US 8,304,976 B2
(45) Date of Patent: Nov. 6, 2012

(54) ELECTROLUMINESCENT DEVICES WITH COLOR ADJUSTMENT BASED ON CURRENT CROWDING

(75) Inventor: Michael A. Haase, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/379,933

(22) PCT Filed: Jun. 25, 2010

(86) PCT No.: PCT/US2010/040009
§ 371 (c)(1),
(2), (4) Date: Dec. 21, 2011

(87) PCT Pub. No.: WO2011/008474
PCT Pub. Date: Jan. 20, 2011

(65) Prior Publication Data
US 2012/0091882 A1   Apr. 19, 2012

Related U.S. Application Data

(60) Provisional application No. 61/221,664, filed on Jun. 30, 2009.

(51) Int. Cl.
*H01J 1/62* (2006.01)
*H01J 63/04* (2006.01)
(52) U.S. Cl. ........................ 313/498; 313/502
(58) Field of Classification Search .................. 313/498, 313/504, 502; 257/98
See application file for complete search history.

(56) References Cited

U.S. PATENT DOCUMENTS

| | | | |
|---|---|---|---|
| 3,526,801 | A | 9/1970 | Kruse |
| 5,048,035 | A | 9/1991 | Sugawara |
| 5,600,158 | A | 2/1997 | Noto |
| 5,861,717 | A | 1/1999 | Begemann |
| 6,016,038 | A | 1/2000 | Mueller |
| 6,636,003 | B2 | 10/2003 | Rahm |
| 6,902,987 | B1 | 6/2005 | Tong |
| 7,026,653 | B2 | 4/2006 | Sun |
| 7,078,319 | B2 | 7/2006 | Eliashevich |

(Continued)

FOREIGN PATENT DOCUMENTS
DE    103 54 936    4/2005
(Continued)

OTHER PUBLICATIONS

Cavus et al., "N-type doping of lattice-matched ZnCdSe and ZnxCdyMgl-x-ySe epilayers on InP using ZnCl2", Journal of Applied Physics, vol. 84, No. 3, pp. 1472-1475, Aug. 1, 1998, © 1998 American Institute of Physics.

(Continued)

*Primary Examiner* — Mariceli Santiago
*Assistant Examiner* — Glenn Zimmerman
(74) *Attorney, Agent, or Firm* — Kristofor L. Storvick

(57) ABSTRACT

A lighting system provides a system optical output, such as white light, as a function of an applied electrical signal. The system output can be characterized by a color temperature or other measure that represents the color or output spectrum of the output. The system is designed so that the color temperature changes as a function of the applied electrical signal. The changes in color temperature are at least in part a result of a phenomenon known as "current crowding".

19 Claims, 8 Drawing Sheets

U.S. PATENT DOCUMENTS

| | | |
|---|---|---|
| 7,126,160 B2 | 10/2006 | Sun |
| 7,141,445 B2 | 11/2006 | Sugawara |
| 7,202,613 B2 | 4/2007 | Morgan |
| 7,217,959 B2 | 5/2007 | Chen |
| 7,223,998 B2 | 5/2007 | Schwach |
| 7,279,716 B2 | 10/2007 | Chen |
| 7,288,902 B1 | 10/2007 | Melanson |
| 7,358,679 B2 | 4/2008 | Lys |
| 7,361,938 B2 | 4/2008 | Mueller |
| 7,387,405 B2 | 6/2008 | Ducharme |
| 7,402,831 B2 | 7/2008 | Miller |
| 7,417,260 B2 | 8/2008 | Wuu |
| 2002/0182319 A1 | 12/2002 | Ben-Malek |
| 2003/0010987 A1 | 1/2003 | Banin |
| 2005/0110034 A1 | 5/2005 | Fujiwara |
| 2005/0230693 A1 | 10/2005 | Chen |
| 2005/0274967 A1 | 12/2005 | Martin |
| 2005/0280013 A1 | 12/2005 | Sun |
| 2006/0001056 A1 | 1/2006 | Saxler |
| 2006/0124917 A1* | 6/2006 | Miller et al. ............... 257/13 |
| 2006/0202215 A1 | 9/2006 | Wierer, Jr. |
| 2007/0221867 A1 | 9/2007 | Beeson |
| 2007/0284565 A1 | 12/2007 | Leatherdale |
| 2007/0290190 A1 | 12/2007 | Haase |
| 2008/0111123 A1 | 5/2008 | Tu |
| 2008/0230795 A1 | 9/2008 | Dias |
| 2008/0272712 A1* | 11/2008 | Jalink et al. ............... 315/291 |
| 2008/0297027 A1 | 12/2008 | Miller |
| 2009/0014736 A1* | 1/2009 | Ibbetson et al. ............. 257/98 |
| 2009/0108269 A1 | 4/2009 | Negley |
| 2010/0117997 A1 | 5/2010 | Haase |

FOREIGN PATENT DOCUMENTS

| | | |
|---|---|---|
| EP | 1 010 773 | 6/2000 |
| EP | 1 517 379 | 3/2005 |
| JP | 61-144078 | 7/1986 |
| JP | 2000-091707 | 3/2000 |
| KR | 10-0829925 | 8/2008 |
| WO | WO 00/76005 | 12/2000 |
| WO | WO 2006/062588 | 6/2006 |
| WO | WO 2007/034367 | 3/2007 |
| WO | WO 2007/073449 | 6/2007 |
| WO | WO 2007/114614 | 10/2007 |
| WO | WO 2008/109296 | 9/2008 |
| WO | WO 2009/036579 | 3/2009 |
| WO | WO 2009/048704 | 4/2009 |
| WO | WO 2009/148717 | 12/2009 |
| WO | WO 2009/158191 | 12/2009 |
| WO | WO 2010/019594 | 2/2010 |
| WO | WO 2010/027648 | 3/2010 |
| WO | WO 2010/028146 | 6/2010 |
| WO | WO 2009/158138 | 7/2010 |
| WO | WO 2010/074987 | 7/2010 |
| WO | WO 2010/033379 | 11/2010 |
| WO | WO 2010/129409 | 11/2010 |
| WO | WO 2010/129412 | 11/2010 |
| WO | WO 2011/002686 | 1/2011 |
| WO | WO 2011/008476 | 1/2011 |

OTHER PUBLICATIONS

Chang et al., "MBE Growth and Characterization of (ZnMG)(SeTe)", Journal of the Korean Physical Society, vol. 34, pp. S4-S6, Apr. 1999.

CIE, International Commission on Illumination, Technical Report, ISBN 978 3 900734 57 2, 13.3, 1995.

Guo et al., "Photon Recycling Semiconductor Light Emitting Diode", IEEE Xplore, 4 pages, Downloaded on Oct. 29, 2008, © 1999 IEEE.

Horng et al., "Phosphor-Free White Light From InGaN Blue and Green Light-Emitting Diode Chips Covered With Semiconductor-Conversion AlGaInP Epilayer", IEEE Photonics Technology Letters, vol. 20, No. 13, pp. 1139-1141, Jul. 1, 2008.

Horng et al., "Red-enhanced white light-emitting diodes using external AlGaInP epilayers with various aperture ratios", Journal of Luminescence, vol. 128, pp. 647-651, 2008, © 2007 Elsevier B.V.

Jones, E. D., "Diffusion of Indium Into Cadmium Sulphide", Journal of Physical Chemistry Solids, vol. 39, pp. 11-18, Pergamon Press, Great Britain, 1978.

Kobayashi, Naoki, "Single quantum well photoluminescence in ZnSe/GaAs/AlGaAs grown by migration-enhanced epitaxy", Applied Physics Letters, vol. 55, No. 12, pp. 1235-1237, Sep. 18, 1989, © 1989 American Institute of Physics.

Krystek, M., "An Algorithm to Calculate Correlated Colour Temperature", Color Research and Application, vol. 10, pp. 38-40, © 1985 by John Wiley & Sons, Inc.

Litz et al., "Epitaxy of $Zn_{1-x}Mg_xSeTe_{1-y}$ on (100) InAs", Journals of Crystal Growth, vol. 159, pp. 54-57, 1999.

Odnoblyudov, V.A. and Tu, C. W., "Gas-source molecular-beam eptitaxial growth of Ga(In)NP on GaP(100) substrates for yellow-amber light-emitting devices", Journal of Vacuum Science and Technology B, vol. 23, No. 3, pp. 1317-1319, May/Jun. 2005, © 2005 American Vacuum Society.

Official Journal of the European Union, "Directive 2002/95/EC of the European Parliament and of the Council, of Jan. 27, 2003, on the restriction of the use of certain hazardous substances in electrical equipment", pp. L 37/19 to L 37/23, Feb. 2, 2003.

Official Journal of the European Union, "Commission Decision, of Aug. 18, 2005, amending Directive 2002/95/EC of the European Parliament and of the Council for the purpose of establishing the maximum concentration values for certain hazardous substances in electrical and electronic equipment", 2005/618/EC, p. L 214/65, Aug. 19, 2005.

Sethi, B.R. and Mather P. C., "Effect of Heavy Doping of ZnSe Crystals with Indium in Creating Compensating Acceptors", Physica Status Solidi. (a), pp. 717-721, 1978.

Search Report for International Application No. PCT/US2010/040009, 4 pages, Date of Mailing Oct. 15, 2010.

Schubert, Fred E., Light Emitting Diodes, pp. 133-144, Second Edition, Universtity Press, Cambridge, U.K., © E. Fred Schubert, 2006.

Schubert, Fred E., Light Emitting Diodes, pp. 209-211, Second Edition, Universtity Press, Cambridge, U.K., © E. Fred Schubert, 2006.

Takashima et al., "Proposal of a novel BeZnSeTe quaternary for II-VI middle range visible light emitting devices on InP substrates", Physica Status Solidi (b), vol. 241, No. 3, pp. 747-750, © 2004 Wiley-VCH.

Zeng et al., "Red-green-blue photopumped lasing from ZnCdMgSe/ZnCdSe quantum well laser structures grown on Inp", Applied Physics Letters, vol. 72, No. 24, pp. 3136-3138, Jun. 15, 1998, © 1998 American Institute of Physics.

Written Opinion for International Application No. PCT/US2010/040009, 8 pages, Date of Mailing Oct. 15, 2010.

\* cited by examiner

US 8,304,976 B2

ELECTROLUMINESCENT DEVICES WITH COLOR ADJUSTMENT BASED ON CURRENT CROWDING

CROSS-REFERENCE TO RELATED APPLICATIONS

This application is a national stage filing under 35 U.S.C. 371 of PCT/US2010/040009, filed on Jun. 25, 2010, which claims priority to U.S. Provisional Application No. 61/221,664, filed on Jun. 30, 2009, the disclosure of which is incorporated by reference in its/their entirety herein.

Reference is made to the following pending and/or commonly filed U.S. patent applications, the features of which can be incorporated into the embodiments presently disclosed: U.S. application Ser. No. 61/175,640, "Re-Emitting Semiconductor Construction With Enhanced Extraction Efficiency", filed May 5, 2009; U.S. application Ser. No. 61/175,632, "Semiconductor Devices Grown on Indium-Containing Substrates Utilizing Indium Depletion Mechanisms", filed May 5, 2009; U.S. application Ser. No. 61/175,636, "Re-Emitting Semiconductor Carrier Devices For Use With LEDs and Methods of Manufacture", filed May 5, 2009; and U.S. application Ser. No. 61/221,660, "White Light Electroluminescent Devices With Adjustable Color Temperature", filed on even date herewith.

FIELD OF THE INVENTION

This invention relates generally to solid state semiconductor light sources.

BACKGROUND

A wide variety of semiconductor devices, and methods of making semiconductor devices, are known. Some of these devices are designed to emit light, such as visible or near-visible (e.g. ultraviolet or near infrared) light. Examples include electroluminescent devices such as light emitting diodes (LEDs) and laser diodes, wherein an electrical drive current or similar electrical signal is applied to the device so that it emits light. Another example of a semiconductor device designed to emit light is a re-emitting semiconductor construction (RSC).

Unlike an LED, an RSC does not require an electrical drive current from an external electronic circuit in order to emit light. Instead, the RSC generates electron-hole pairs by absorption of light at a first wavelength $\lambda_1$ in an active region of the RSC. These electrons and holes then recombine in potential wells in the active region to emit light at a second wavelength $\lambda_2$ different from the first wavelength $\lambda_1$, and optionally at still other wavelengths $\lambda_2$, $\lambda_3$, and so forth depending on the number of potential wells and their design features. The initiating radiation or "pump light" at the first wavelength $\lambda_1$ is typically provided by a blue, violet, or ultraviolet emitting LED coupled to the RSC. Exemplary RSC devices, methods of their construction, and related devices and methods can be found in, e.g., U.S. Pat. No. 7,402,831 (Miller et al.), U.S. Patent Application Publications US 2007/0284565 (Leatherdale et al.) and US 2007/0290190 (Haase et al.), PCT Publication WO 2009/048704 (Kelley et al.), and pending U.S. Application Ser. No. 61/075,918, "Semiconductor Light Converting Construction" (Attorney Docket No. 64395US002), filed Jun. 26, 2008, all of which are incorporated herein by reference.

When reference is made herein to a light at a particular wavelength, the reader will understand that reference is being made to light having a spectrum whose peak wavelength is at the particular wavelength.

Of particular interest to the present application are light sources that are capable of emitting white light. In some cases, known white light sources are constructed by combining an electroluminescent device such as a blue-emitting LED with first and second RSC-based luminescent elements. The first luminescent element may, for example, include a green-emitting potential well that converts some of the blue light to green light, and transmits the remainder of the blue light. The second luminescent element may include a potential well that converts some of the green and/or blue light it receives from the first luminescent element into red light, and transmits the remainder of the blue and green light. The resulting red, green, and blue light components combine to allow such a device, which is described (among other embodiments) in WO 2008/109296 (Haase), to provide substantially white light output.

Other known white light sources are constructed by combining a blue-emitting LED with a layer of yellow phosphor, such as cerium-doped yttrium aluminum garnet (YAG:Ce). Some of the blue light is absorbed by the phosphor and re-emitted as yellow light, and some of the blue light passes through the phosphor layer. The transmitted blue light combines with the re-emitted yellow light to produce an output beam having an overall output spectrum that is perceived as nominally white light.

Device-to-device variations in phosphor layer characteristics and/or other design details give rise to device-to-device differences in the output spectrum and corresponding differences in perceived color, with some LED/phosphor devices providing a "cool" white color and others providing a "warm" white color, for example. A given "shade" of white may be plotted as an (x,y) color coordinate on a conventional CIE chromaticity diagram, and can be characterized by a color temperature as is known by those skilled in the art. U.S. Pat. No. 7,387,405 (Ducharme et al.) discusses some of these aspects of LED/phosphor devices, and reports that some commercial LED/phosphor devices exhibit color temperatures of 20,000 degrees Kelvin (20,000K) while others exhibit color temperatures of 5750K. The '405 patent also reports that a single one of these LED/phosphor devices allows for no control of color temperature, and that a system with a desired range of color temperature cannot be generated with one device alone. The '405 patent goes on to describe an embodiment in which two such LED/phosphor devices are combined with an optical long-pass filter (a transparent piece of glass or plastic tinted so as to enable only longer wavelength light to pass through) that shifts the color temperature of the devices, and then a specific third LED (an Agilent HLMP-EL 18 amber LED) is added to these filtered LED/phosphor devices to provide a 3-LED embodiment with adjustable color temperature.

BRIEF SUMMARY

The present application discloses, inter alia, lighting systems that provide a system optical output as a function of an applied electrical signal. The system output, which in exemplary embodiments is or comprises white light, can be characterized by a color temperature or by any other suitable measure that represents in some fashion the color or output spectrum of the system optical output. Desirably, the lighting system is designed so that the color temperature changes as a function of the applied electrical signal. In exemplary embodiments, these changes in color temperature are at least in part a result of a phenomenon known as "current crowding", which is normally considered to be undesirable in a solid state lighting device, and is described further below.

In exemplary embodiments, the system includes an electroluminescent device and a first light modifying material, such as an RSC or phosphor. The electroluminescent device is adapted to emit light in response to the applied electrical signal. The first light modifying material is adapted to modify a first portion of the emitted light to provide a first light component. The lighting system combines the first light component with at least a second light component associated with a second portion of the emitted light, to produce the system optical output. The system may be characterized by a relative proportion of the first to the second light component, and the changes in color temperature may be associated with changes in the relative proportion.

In further exemplary embodiments, the emitted light is emitted from an output surface of the electroluminescent device, and the electroluminescent device is characterized in that a spatial distribution of the emitted light over the output surface changes as a function of the applied electrical signal, the changes in the spatial distribution being at least in part as a result of current crowding. The system may also include a second light modifying material that modifies the second portion of the emitted light to provide the second light component, the second light component having a second spectrum different from the first spectrum and from the emitted light spectrum. The first light modifying material may cover a first portion of the output surface, and the second light modifying material may cover a second portion of the output surface. For example, the electroluminescent device may include an electrical contact disposed on the output surface, and the first portion of the output surface may be disposed proximate the electrical contact, whereas the second portion of the output surface may be spaced apart from the electrical contact, for example.

Also disclosed are lighting systems that include an electroluminescent device and a first light converting material. The electroluminescent device is adapted to emit light from an output surface in response to an applied electrical current, the electroluminescent device being characterized in that a spatial distribution of the emitted light over the output surface changes as a function of the electrical current at least in part as a result of current crowding. The first light converting material covers a first portion of the output surface, and is adapted to convert a first portion of the emitted light to a first light component. The first light component combines with at least a second light component to provide a system output, and the second light component is associated with a second portion of the emitted light. The first light converting material is spatially distributed such that the changes in the spatial distribution of the emitted light over the output surface produce changes in a color of the system optical output.

In some cases, the second light component may not be associated with any light converting material. For example, the second light component may simply be or comprise the second portion of the emitted light, which may be emitted from a second portion of the output surface. Alternatively, the system may include a second light converting material that covers the second portion of the output surface, and that converts the second portion of the emitted light to the second light component. Note that in addition to including the first and second light components, the system optical output may also include other components such as light that is emitted by the electroluminescent device but not converted to other light by any light converting material. The system optical output may be or include white light, for example, and the changes in color may comprise changes in a color temperature of the system optical output.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

DETAILED DESCRIPTION OF ILLUSTRATIVE EMBODIMENTS

Optoelectronic device manufacturers consider the phenomenon known as "current crowding" to be a problem that should be avoided, since it is generally associated with reduced quantum efficiency. See e.g. U.S. Pat. No. 7,078,319 (Eliashevich et al.). However, at least some of the lighting systems described herein are intentionally designed to exhibit current crowding, and to take advantage of it in order to produce color changes as a function of an applied electrical signal. Notwithstanding this, we emphasize that we do not wish to be bound by theory, and that any lighting system that is capable of changing a color of its system optical output based on an applied electrical signal, in a manner that is the same as or similar to any of the embodiments described herein, is intended to be encompassed by the present application even if such a lighting system does not in fact exhibit current crowding.

Figure 1A:
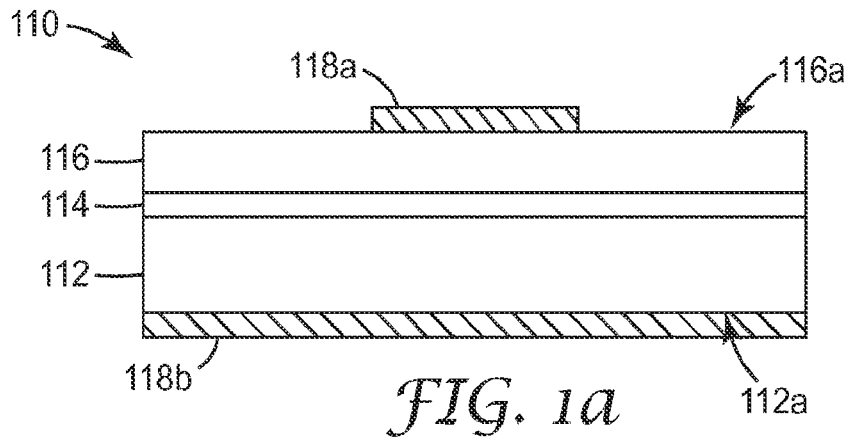
FIGS. 1a-c are schematic sectional views of an electroluminescent device that exhibits the current crowding phenomenon.
Figure 1B:
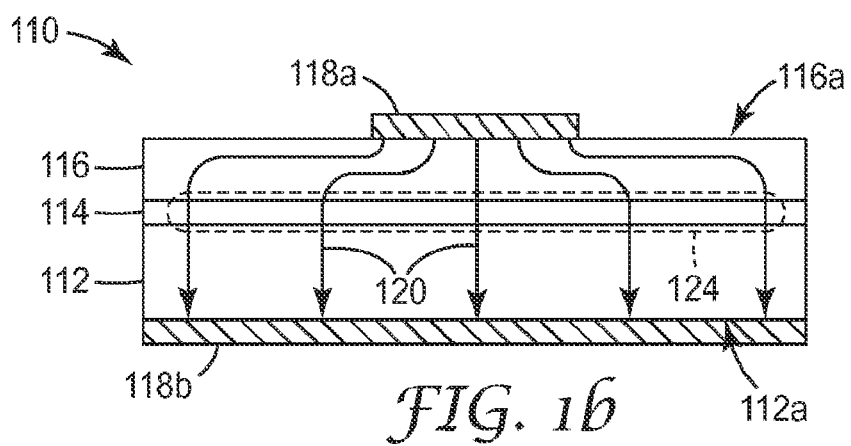
Figure 1C:
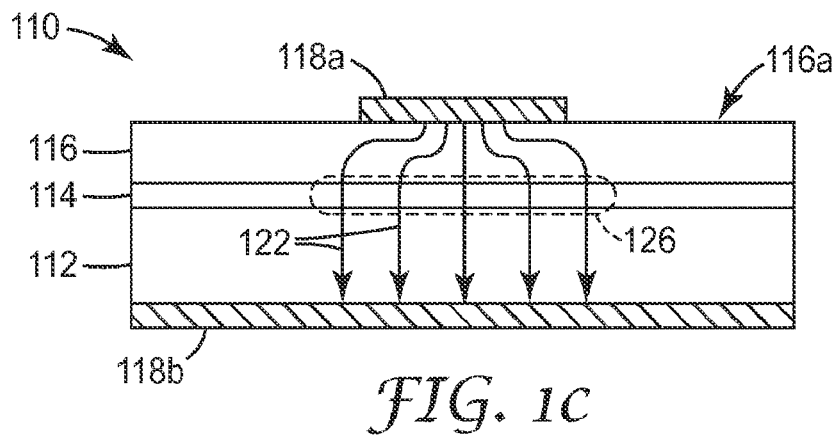

Referring now to FIG. 1a, we see there a schematic sectional view of a semiconductor electroluminescent device 110 such as an LED, which is reproduced in FIGS. 1b and 1c. The reader will understand that the layer construction of the device 110 is depicted only schematically for purposes of illustration, that the constituent elements of the device are not necessarily drawn to scale, and that additional elements may be included or illustrated elements may be omitted or modified as desired. As shown, the device 110 includes a semiconductor base layer 112, a light-emitting layer 114, and a current spreading layer 116. The base layer 112 may be or comprise, for example, p-type GaN, or other suitable semiconductor materials. Light-emitting layer 114 may be or comprise an active layer sandwiched between a p-type cladding layer and an n-type cladding layer (not shown), each of which may comprise, for example, AlGaInN-based materials, or other suitable semiconductor materials. Current spreading layer 116 may be or comprise, for example, an n-type semiconductor such as GaN-based material that is doped with a concentration of n-type dopant such as Si, or other suitable semiconductor materials.

Also provided are first and second electrodes 118a, 118b that make ohmic contact with the respective outer semiconductor layers so that an electrical drive current or similar electrical signal supplied by an external electronic circuit can be applied to the device such that it emits light. The device 110 may be made with an asymmetrical design, as shown, in order to emit light preferentially from one of its major surfaces, e.g. outer surface 116a of layer 116. For this reason, first electrode 118a can be made to cover only a portion of surface 116a, whereas second electrode 118b can be made to cover substantially all of the opposite major surface 112a. If the second electrode 118b is at least partially reflective, e.g. metallic, then some light generated within the device 110 that would otherwise escape via major surface 112a can be reflected by the electrode 118b so that it escapes via the side surfaces or the major surface 116a of the device. Of course, semiconductor electroluminescent devices that may be used in the disclosed embodiments need not be asymmetric in the forward/backward characteristic of their light emission, or in the arrangement of their electrodes.

FIGS. 1b and 1c show in a qualitative, schematic fashion the behavior of the device 110 when an electrical signal is applied across the electrodes. In FIG. 1b, a first signal having a first magnitude is applied. In FIG. 1c, a second signal having a second magnitude is applied. The signal magnitudes may be characterized as desired, but, in view of the I-V (current-voltage) characteristics of most semiconductor diode devices, it is most logical to characterize the signal magnitude in terms of electric current. Alternatively, one can characterize the signal magnitude in terms of electric potential (voltage). In any case, the electric current distribution from electrode 118a through the interior of the device 110 to the other electrode 118b is depicted by arrows 120 for the first signal (FIG. 1b), and by arrows 122 for the second signal (FIG. 1c).

Recalling that the respective signals are being applied to the very same device 110, the difference in current distributions exemplified by the different width or lateral dimension of the pattern of arrows 120 compared to that of arrows 122 is a result of the different magnitudes of the respective signals and the "current crowding" phenomenon. As is apparent from the figures, current crowding results in a narrower or more concentrated current distribution for the second signal (FIG. 1c) compared to the first signal (FIG. 1b). This current crowding phenomenon typically occurs at high current densities. That is, the second signal would typically have a greater signal magnitude, measured in electric current, than the first signal. In the case of device 110, the current crowding may be the result of the p-n junction having a decreased electrical resistance at the higher current levels. The decreased resistance tends to cause the current to flow in a more direct path from electrode 118a to electrode 118b, producing current "bunching" under the electrode 118a compared to the current distribution of FIG. 1b.

The change in current distribution within the device for different signal magnitudes also has an effect on the spatial distribution of light generated by the device 110. This is because the light emitting layer 114 will generate light only to the extent electric current is flowing through it. Portions of the light emitting layer in which the current density is low will generate less light than portions in which the current density is high, within limits. By specifying a cutoff value of generated light per unit volume, or per unit projected area (e.g., when viewing the device along an axis perpendicular to the major surface 116a), one can define a high-intensity region of the light emitting layer 114. The cutoff value may be, for example, a fraction of a reference light emission level, where the reference level may be a maximum light emission, or a spatially averaged light generation over the entire light emitting layer, and where the fraction may be selected as desired such as ½, $1/10^{th}$, or 1/e of the reference value. Whichever of these parameters one selects, one can use the resulting cutoff value to provide a consistent way to characterize the spatial extent of the higher-intensity region of the light emitting layer. The higher-intensity region is identified by label 124 in FIG. 1b and by label 126 in FIG. 1c. As one would expect, the region 124 has a greater width or lateral dimension than region 126. This may be the case even though region 124 may have greatly reduced overall light emission levels compared to region 126, in view of the (typically) substantially greater electric current level used to produce region 126 compared to region 124.

The differences in the lateral dimension or other spatial extent of the regions 124, 126 give rise to corresponding differences in the spatial distribution of light emitted from the outer surface 116a of the device. Thus, the relatively wide region 124 gives rise to a relatively wide spatial distribution of light emitted from the surface 116a, compared to the relatively narrow region 126, which gives rise to a narrower spatial distribution of light emitted from the surface 116a. Stated differently, the spatial distribution of light emitted from surface 116a using the second signal is more concentrated towards the electrode 118a than that of the first signal. Just as with the regions 124, 126, the spatial distribution of light emitted from the surface 116a may be characterized or measured in relative terms, e.g., as a fraction or percentage of a maximum or average value, for example. Thus, assuming the second signal has a greater magnitude than the first signal, differences in their respective spatial distributions of emitted light from the surface 116a are independent of the fact that the overall amount of light emitted from the surface 116a may be greater for the second signal than for the first signal.

In large part, the degree of current crowding may be controlled by the sheet resistivity of the current-spreading layer. Mathematical models of such current crowding effects may be found in Chapter 8 of *Light-Emitting Diodes*, Second Edition, by E. Fred Schubert (Cambridge University Press).

Having now described the current crowding phenomenon, or certain aspects thereof, and its effect on the spatial distribution of light emitted from the surface of an electroluminescent device, we now go on to describe how this can be used to provide lighting systems whose optical output, e.g. white light, can be made to change color, e.g. color temperature, based on an applied electrical signal.

Figure 2A:
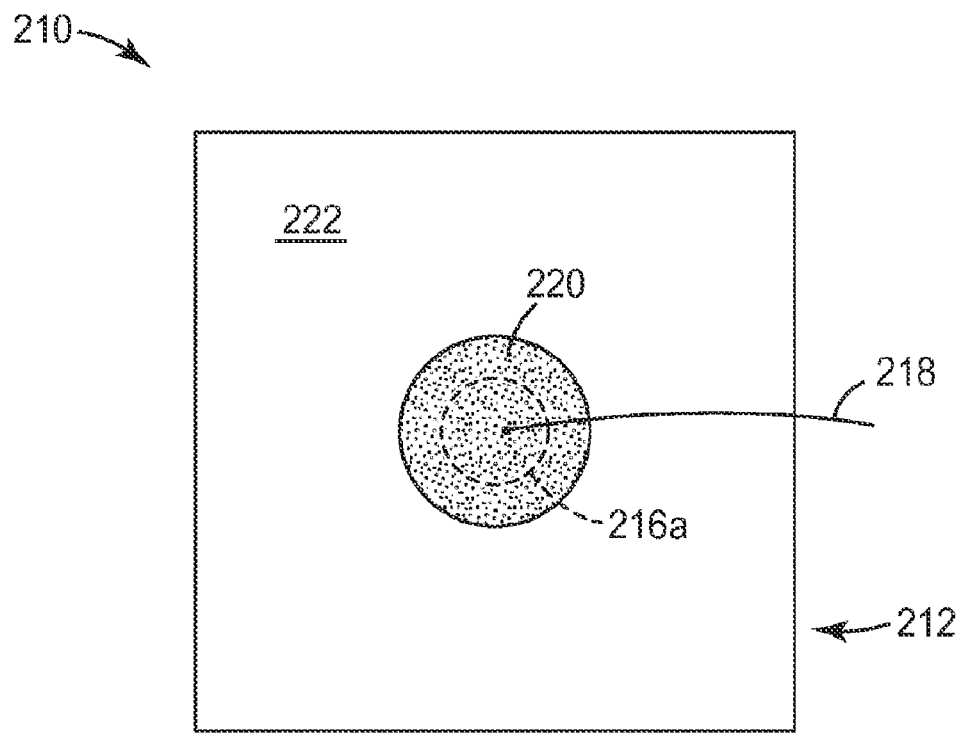
FIG. 2a is a schematic top view and FIG. 2b is a schematic sectional view of a lighting system.
Figure 2B:
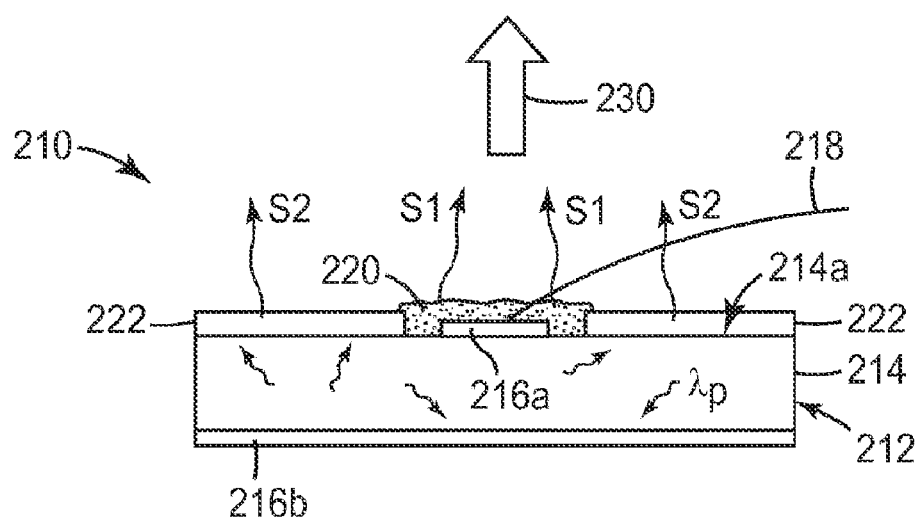

A lighting system 210 is shown in a schematic top view in FIG. 2a and in a schematic sectional view in FIG. 2b. The system comprises an electroluminescent device 212 adapted to emit light in response to an applied electrical signal. The electroluminescent device 212 includes a main body 214 to which first and second electrodes 216a, 216b have been applied at outer surfaces thereof. The main body 214 is drawn schematically, and may comprise any suitable stack of semiconductor layers (not shown individually) such as would be found in a semiconductor LED, for example. The main body may be in the form of an individual chip or die, as shown, or in the form of an entire semiconductor wafer prior to dicing. Significantly, the layers that make up the body 214 are designed so that the device 212 exhibits the current crowding phenomenon, or so that it otherwise exhibits a spatial distribution of emitted light that substantially changes as a function of a magnitude of the applied electrical signal. The electrical signal is applied, of course, across the electrodes 216a, 216b, where a thin wire 218 may connect to the electrode 216a via a wire bond to help convey the signal from an external electrical driver or source to the device 212. The light generated within the device 212 may escape or be emitted via the relatively small side surfaces or via the major surface 214a, to which the first electrode 216a is applied. Such emitted light may be referred to as pump light, and is labeled $\lambda_p$ in the figure. The pump light may be or comprise blue, violet, or ultraviolet light, e.g., with a peak wavelength in a range from 350 to 500 nm, but other spectral characteristics of the pump light are also contemplated.

As a result of the design of the electroluminescent device, a spatial distribution of pump light $\lambda_p$ that is emitted from the surface 214a substantially changes as a function of a magnitude of the applied electrical signal. For example, a first electrical signal having a relatively small magnitude may provide pump light whose spatial distribution as emitted from the surface 214a is relatively uniform, and a second electrical signal having a larger magnitude may provide pump light whose spatial distribution as emitted from the surface 214a is concentrated in a smaller area such as an annulus surrounding the electrode 216a.

In addition to the electroluminescent device 212, the system 210 also includes first and second light modifying materials 220, 222. These materials may convert at least some of the pump light striking them into light components of other wavelengths. For example, first light modifying material 220 may be or comprise a phosphor that converts at least some of the pump light $\lambda_p$ striking it into a first light component at another wavelength $\lambda_1$, typically longer than a wavelength of the pump light. The second light modifying material may be or comprise an RSC having at least one potential well that converts at least some of the pump light $\lambda_p$ striking it into a second light component at another wavelength $\lambda 2$ different from $\lambda_1$, and also typically longer than a wavelength of the pump light. One or both of light modifying materials 220, 222 may also be partially transparent to the pump light, such that light propagating out of first light modifying material 220 may comprise a combination or mixture of the first light component at wavelength $\lambda_1$ and the pump light $\lambda_p$, and/or light propagating out of second light modifying material 222 may comprise a combination or mixture of the second light component at wavelength $\lambda_2$ and the pump light $\lambda_p$. Alternatively, both light modifying materials 220, 222 may be substantially opaque to the pump light $\lambda_p$. In any case, light propagating out of the first light modifying material 220 may be characterized by a spectrum S1, which includes at least the first light component at wavelength $\lambda_1$ and may also include the pump light, whereas light propagating out of the second light modifying material 222 may be characterized by a different spectrum S2, which includes at least the second light component at wavelength $\lambda_2$ and may also include the pump light.

The light characterized by the spectra S1 and S2 combine, whether by free space propagation or via mechanisms such as optical diffusers, lenses, mirrors, or the like, and optionally with other light components, to produce a system optical output of lighting system 210 represented schematically by arrow 230. The system optical output 230 thus includes some amount of the light of the first spectrum S1 and some amount of the light of the second spectrum S2. Stated differently, the system optical output 230 includes some amount of the first light component at wavelength $\lambda_1$ and some amount of the second light component at wavelength $\lambda_2$. The different spectra S1, S2 are associated with different perceived colors, and their combination (optionally with other light components) produces yet another perceived color for the system optical output 230. The perceived color (e.g. a color temperature) of the system optical output 230 can thus be adjusted or changed by changing the relative amounts of the first and second light components that are included in the system optical output 230.

In view of the current-crowding characteristics of the electroluminescent device 212 described above, such a change in the relative amounts of light provided by the first and second light modifying materials can be achieved by simply changing the magnitude of the applied electrical signal, provided the first and second light modifying materials 220, 222 are spatially distributed in a way that is synergistic with the changes in the spatial distribution of the pump light that is emitted from the surface 214a. For example, if a change in the applied electrical signal results in more pump light emitted from a first portion of the surface relative to a second portion, and if the first light modifying material is disposed at the first portion while the second light modifying material is disposed at the second portion, then the change in the applied electrical signal may provide relatively more of the first light component (or of the light of spectrum S1) and relatively less of the second light component (or of the light of spectrum S2) in the system optical output 230, thus changing the perceived color of the system optical output.

In the embodiment of FIGS. 2a-b, the first light modifying material 220 is disposed in a circle or an effective annulus proximate the electrode 220. The second light modifying material 222 is disposed on the remainder of the surface 214a, i.e., spaced apart from the electrode 220. This spatial arrangement of light modifying materials 220, 222 is synergistic with the changes in the spatial distribution of the pump light resulting from the current crowding phenomenon. At low electrical current levels, a relatively uniform distribution of pump light is emitted from surface 214a, which produces an initial or baseline proportion of the light of spectrum S1 to the light of spectrum S2 in the system optical output. At a higher electrical current, at which current crowding confines the spatial distribution of emitted pump light to a smaller area such as an annulus surrounding the electrode 216a, the system optical output 230 will include relatively more of the light of spectrum S1 and relatively less of the light of spectrum S2, thus yielding a different proportion of such light components and a different perceived color of the system optical output 230. The first and second light modifying materials may be selected as appropriate so that the change in color of the system optical output for an increase in magnitude of the applied electrical signal corresponds to an increase in color temperature of a nominally white light output. Alternatively, the light modifying materials may be selected to produce an opposite effect, wherein the change in color of the system optical output for an increase in magnitude of the applied electrical signal corresponds to a decrease in color temperature of a nominally white light output.

In alternative embodiments to that shown in FIGS. 2a-b, the first light modifying material 220 may be omitted, or the second light modifying material 222 may be omitted, such that only one light modifying material is included in the lighting system. Thus, for example, if the first light modifying material 220 is omitted, then the light of spectrum S1 may include only pump light of wavelength $\lambda_p$ that is emitted from the annular region of the surface 214a surrounding the electrode 216a. Alternatively, if the second light modifying material 222 is omitted, then the light of spectrum S2 may include only pump light of wavelength $\lambda_p$ that is emitted from the portion of surface 214a outside of such annular region.

In still other alternative embodiments, additional light modifying materials such as a third, fourth, etc. light modifying material, may be provided and spatially arranged with the other light modifying materials in patterns that are synergistic with the changes in the spatial distribution of the pump light resulting from the current crowding phenomenon, so that a color of the system optical output changes based on a magnitude of the applied electrical signal. Note that a given light modifying material may convert pump light at wavelength $\lambda_p$ to a light component that is characterized by only a single peak (having e.g. a Gaussian or bell-shaped spectral distribution) at one peak wavelength, or to a light component that is characterized by multiple peaks at multiple peak wavelengths, depending on the design of the light modifying material. An RSC, for example, may comprise only one potential well, or may comprise multiple potential wells of the same or similar design, such that the spectrum of the converted light is characterized by only a single peak. Alternatively, an RSC may comprise multiple potential wells of substantially different design, such that the spectrum of the converted light is characterized by a plurality of peaks.

Those skilled in the art will be familiar with a tool or standard used to characterize and quantify perceived colors, in particular, the well-known 1931 CIE chromaticity diagram, promulgated by the Commission International de l'Eclairage (International Commission on Lighting) or "CIE". The color (or "chromaticity" or "chromaticity coordinates") of a light source or article can be precisely measured or specified by a point or region expressed in terms of one or more chromaticity coordinates (x,y) on the CIE chromaticity diagram, using the CIE 1931 standard colorimetric system.

Figure 3:
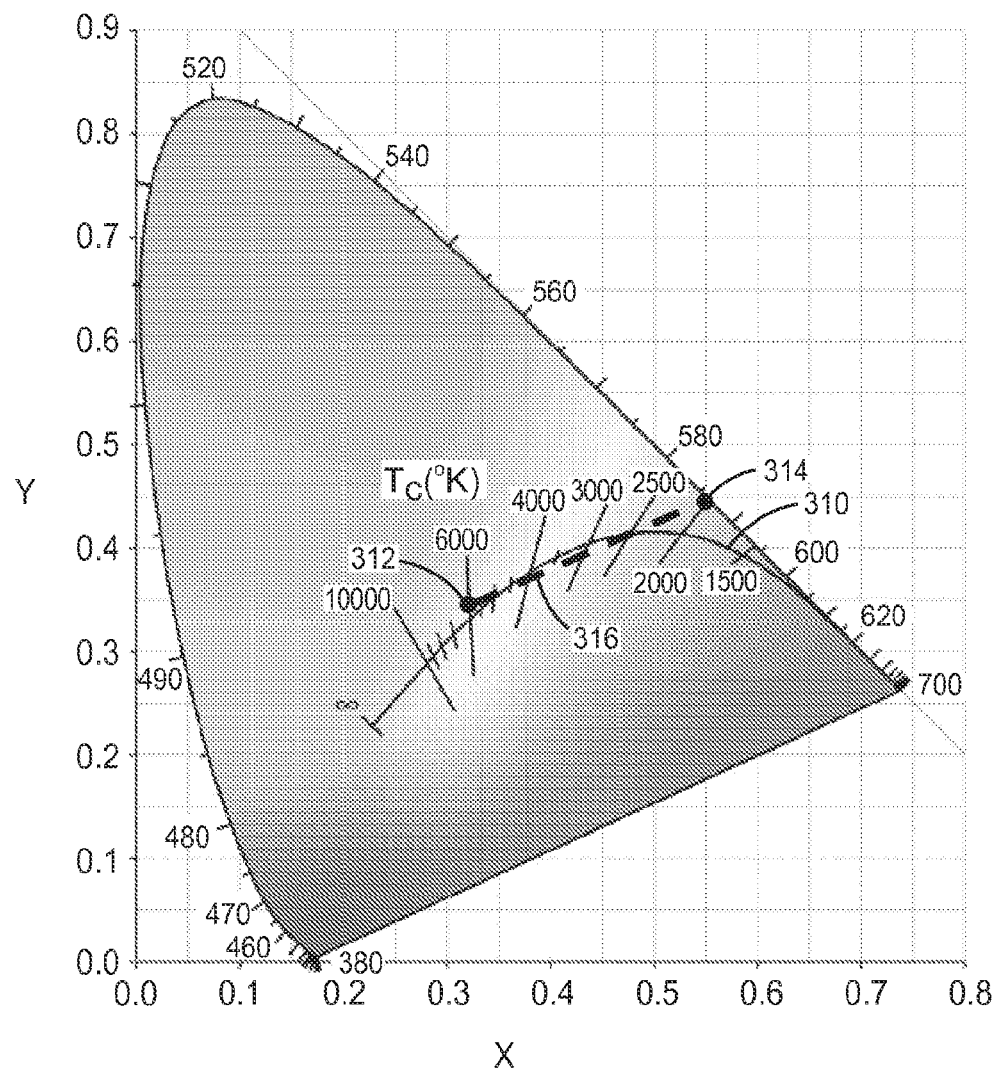
FIG. 3 is a CIE chromaticity diagram on which is plotted a line segment representative of a lighting system.

Such a chromaticity diagram is shown in FIG. 3. Those skilled in the art will recognize curve 310 as the "Planckian locus", i.e., the color of an ideal blackbody source over a range of temperatures measured in degrees Kelvin, which temperature is referred to as "color temperature" $T_c$.

Figure 3A:
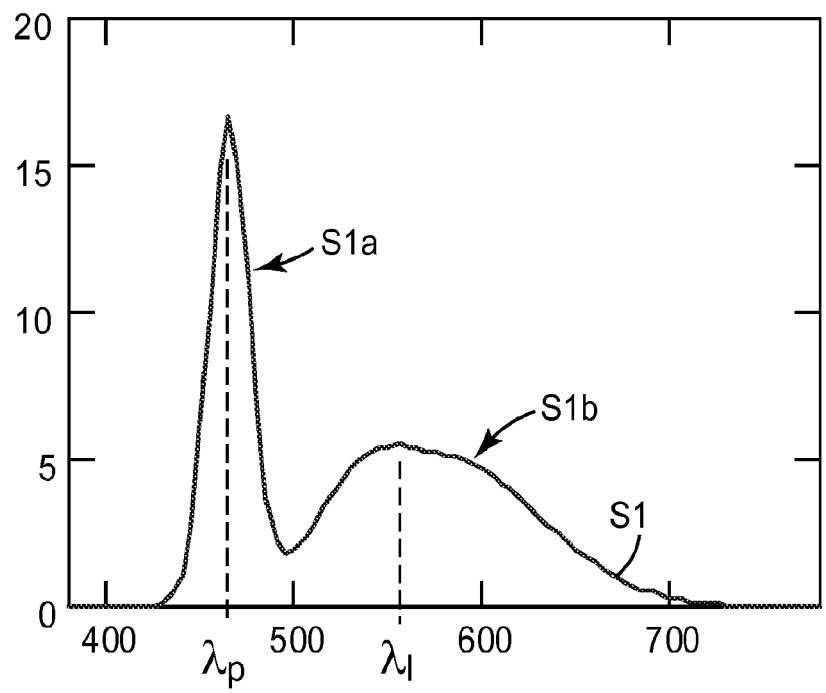
FIGS. 3a and 3b are graphs of the emission spectra of two components of the lighting system of FIG. 3.
Figure 3B:
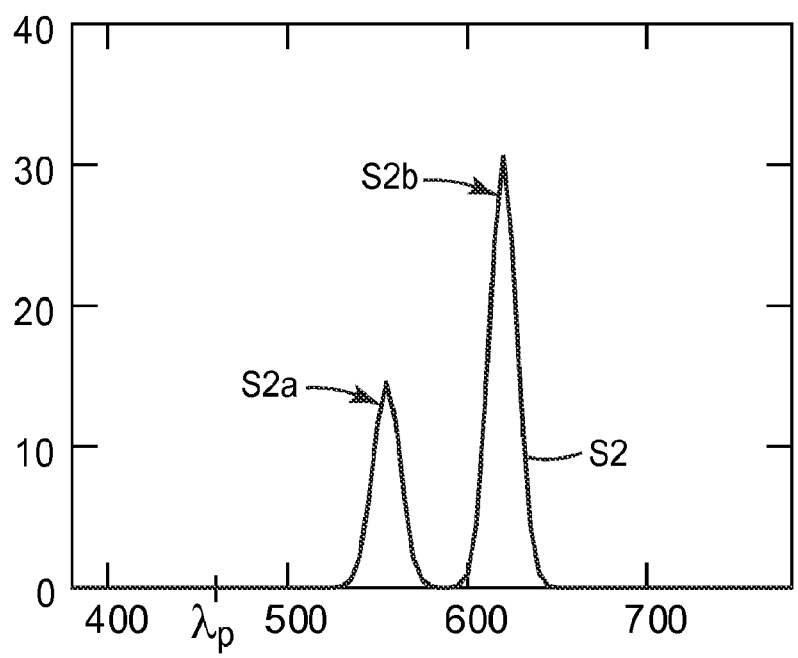

Points 312 and 314 represent the color coordinates of the light of spectrum S1 and the light of spectrum S2, respectively, for one embodiment of the lighting system 210 of FIGS. 2a-b. The spectra of these points are plotted as a function of optical wavelength in FIGS. 3a and 3b, respectively. That is, FIG. 3a plots the spectrum S1 corresponding to point 312 in FIG. 3, and FIG. 3b plots the spectrum S2 corresponding to point 314 in FIG. 3. Spectrum S1 has two main components: a relatively narrow spectral peak S1a corresponding to pump light at wavelength $\lambda_p$ that is transmitted through first light modifying material 220, and a broader spectral peak S1b corresponding to the first light component at wavelength $\lambda_1$ produced by the first light modifying material, e.g., YAG:Ce phosphor. Spectrum S2 also has two main components: a relatively narrow first spectral peak S2a and a relatively narrow second spectral peak S2b. These two peaks can be produced by a blue-LED-pumped RSC that has at least one potential well capable of converting the blue pump light to light at the first peak S2a and at least another potential well capable of converting the pump light to light at the second peak S2b. Note by the absence of any peak at the pump wavelength $\lambda_p$ in spectrum S2 that the second light converting material, i.e., the RSC, absorbs or otherwise effectively blocks all pump light of wavelength $\lambda_p$ incident upon it in this particular embodiment.

The line segment 316 in FIG. 3, whose endpoints are points 312 and 314, represents the set of all possible lighting system optical outputs for systems whose outputs are composed of a linear combination of light of spectrum S1 and light of spectrum S2. Thus, for example, a lighting system whose optical output is composed of equal parts of the light of spectrum S1 and light of spectrum S2 is represented by a point that bisects line segment 316. If the proportion of the light of spectrum 51 is increased, the system point moves along line segment 316 towards point 312. If instead the proportion of the light of spectrum S2 is increased, the system point moves along line segment 316 towards point 314.

By judicious selection of the position (color) of points 312 and 314, the line segment 316 can be made to closely approximate a portion of the Planckian locus 310, e.g., the portion of the locus 310 over a range of color temperatures from 2500K to 5000K, or from 3000K to 5000K, for example. In such a case, a system point on line segment 316 that moves towards point 312 corresponds to a color shift towards higher color temperatures, or a "cooler" (higher blue content) white light source. If instead a system point moves towards point 314, it corresponds to a color shift towards lower color temperatures, or a "warmer" (higher red content) light source. Note that the lighting system 210 of FIGS. 2a-b, utilizing the light modifying materials described in connection with FIGS. 3, 3a, and 3b, generates a system optical output that shifts from lower to higher color temperatures (along the line segment 316 towards point 312) as the magnitude of the applied electrical signal is increased.

The particular shapes of the spectra S1 and S2, when plotted as a function of wavelength, not only determine the positions of their respective points 312, 314 on the CIE chromaticity diagram, but also determine a characteristic known as the "color rendering index" of the resulting system light. The color rendering index (CRI) is a parameter that may be important to a lighting system designer if the designer is concerned not only with the appearance or color of the system optical output as it is perceived by direct observation with the eye, but also with the appearance of objects or articles that are viewed for example in reflected light using the system optical output. Depending on the reflectivity spectrum of the objects or articles, their appearance may be very different when illuminated with a first nominally white light source than when illuminated with a second nominally white light source, even though the first and second white light sources may have identical color coordinates on the CIE chromaticity diagram. This is a consequence of the fact that a particular color coordinate on the CIE chromaticity diagram may be associated with numerous optical spectra that may differ substantially from each other. A common illustration demonstrating the effect of color rendering is the sometimes very different appearance that colored objects have when illuminated with sunlight as compared to illumination with a fluorescent office lights for example, or as compared to illumination with a gas discharge street lamp, even though all of these illumination sources may appear to be nominally white when viewed directly.

The color rendering index of a given source can be measured using the method described in the CIE publication 13.3-1995, "Method of Measuring and Specifying Colour Rendering Properties of Light Sources". The color rendering index in general ranges from a low of 0 to a high of 100, with higher values generally being desirable. Furthermore, numerical techniques and software are available from the CIE, that are capable of calculating the color rendering index of a given spectrum representing a given light source, based on the CIE 13.3-1995 publication.

When such software is used to calculate the color rendering index of system optical outputs composed of a linear combination of the spectra S1 and S2 shown in FIGS. 3a and 3b, the result is a color rendering index of at least 80 over a color temperature range (corresponding to different proportions of the spectra S1 and S2) from 2500K to 5000K. In exemplary embodiments, the color rendering index is at least 60, or at least 70, or at least 80, over a color temperature range from 2500K to 5000K, or from 3000K to 5000K, for example. In order to achieve high color rendering index values, it is desirable to ensure that each of the constituent spectra (S1, S2) that make up the system optical output is characterized by at least two distinct spectral peaks, e.g. the peaks S1$a$, S1$b$ of FIG. 3$a$ or the peaks S2$a$, S2$b$ of FIG. 3$b$, which peaks may be separated from each other by at least 10 nm, for example. Further reference in this regard is made to commonly filed U.S. Application 61/221,660, "White Light Electroluminescent Devices With Adjustable Color Temperature" (Attorney Docket No. 65330US002), which is incorporated herein by reference.

Figure 4:
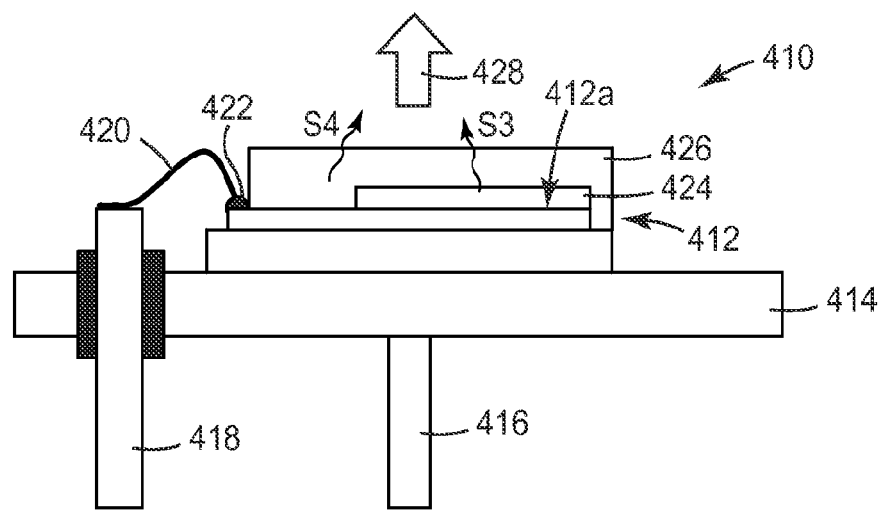
FIG. 4 is a schematic sectional view of a lighting system.

Turning now to FIG. 4, we see there a schematic sectional view of another solid state lighting system 410 capable of exhibiting a substantial color shift as a function of a magnitude of an applied electrical signal, at least in part as a result of current crowding. The system 410 includes a two-terminal semiconductor electroluminescent device 412, such as an LED. The device is mounted on a metal header 414 having a first conductive post 416 electrically coupled to a base electrode of the device 412. A second conductive post 418, electrically insulated from the header 414, electrically couples to a top electrode of the device via a thin wire 420 and wire bond 422. The posts 416, 418 form the two terminals of the system 410, across which the electrical signal is applied to energize the device. The top electrode of the device is smaller than the base electrode, and offset to one side of an output surface 412$a$ of the electroluminescent device 412.

An RSC 424 covers a first portion of the output surface 412$a$, which first portion may as shown be spatially arranged to be spaced apart from the top electrode. The RSC 424 is operable to convert the emitted or pump light generated within the electroluminescent device into a first light component having a spectrum S3, e.g., characteristic of amber light. The spectrum S3 may comprise or consist essentially of a distinct first and second spectral peak, e.g., the same as or similar to the spectrum S2 of FIG. 3$b$. The spectrum S3 may optionally include a distinct third spectral peak corresponding to residual pump light transmitted by the RSC 424, or it may contain no such third spectral peak in the case that RSC 424 substantially blocks such pump light.

A phosphor 426 covers a second portion of the output surface 412$a$, the second portion being different from the first portion, and including areas or zones that are proximate the top electrode. The phosphor 426 is operable to convert at least some of the pump light into a second light component, e.g., yellow light having a spectral peak similar to peak S1$b$ of FIG. 3$a$, to result in emitted light having spectrum S4. The light having spectrum S4 may include not only yellow light generated by the phosphor 426, but also residual pump light transmitted by the phosphor, e.g. as shown in the spectrum S1 of FIG. 3$a$. The light of spectrum S3 and the light of spectrum S4 are combined, optionally with other light components, to provide system optical output 428, e.g., white light, whose color temperature is dependent upon the relative amounts or proportion of the first and second light components included in the system output.

Changes in color temperature of the system output with a changing magnitude of the applied electrical signal are achieved by ensuring that the electroluminescent device 412 exhibits current crowding, i.e., that the spatial distribution of the pump light emitted over the output surface 412$a$ substantially changes as a function of such magnitude, and further by ensuring that such changes in the spatial distribution of emitted light are synergistic with the spatial distributions of the RSC 424 and phosphor 426 so that the relative amounts or proportion of the first and second light components included in the system output change in a corresponding fashion. In particular, by offsetting the top electrode to one side of the electroluminescent device, opposite the RSC 424, the effects of the current crowding phenomenon are promoted.

Figure 5:
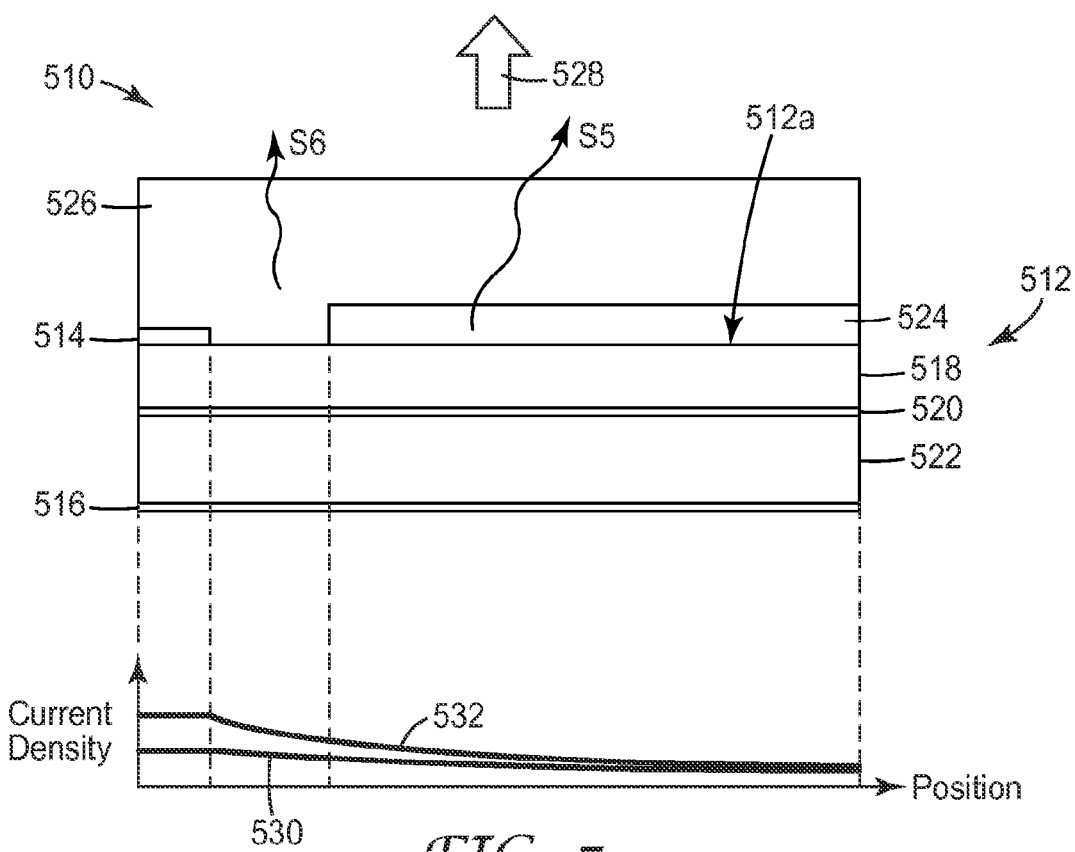
FIG. 5 is a schematic sectional view of a lighting system with an associated graph of current density as a function of position.

FIG. 5 shows a schematic sectional view of a lighting system 510 similar to system 410, along with an associated graph of current density as a function of position. The system 510 includes an electroluminescent device 512 having an output surface 512$a$ from which pump light generated within the device is emitted. The device 512 also includes a top electrode 514, a base electrode 516, and constituent semiconductor layers 518, 520, 522, which layers may be or comprise a current spreading layer, a p-n junction layer, and a substrate layer respectively. The current spreading layer may comprise, for example, AlGaInN, or other suitable semiconductor material; the p-n junction may comprise, for example, GaInN, or other suitable semiconductor material; and the substrate layer may comprise, for example, silicon, or other suitable semiconductor material. A first light modifying material 524, which may be substantially the same as RSC 424 of FIG. 4, covers a first portion of the output surface 512$a$ and receives a first portion of the pump light. A second light modifying material 526, which may be substantially the same as phosphor 426 of FIG. 4, covers a second portion of the output surface 512$a$ and receives a second portion of the pump light. Light emitted from the first light modifying material, having a spectrum S5, and light emitted from the second light modifying material, having a spectrum S6 different from S5, combine to form a system optical output 528.

Due to the geometry or layout of the electrodes 514, 516, and one or more electrical properties of one or more constituent layers of the electroluminescent device 512 that change in response to a magnitude of the electrical signal applied across the electrodes, a substantial current crowding phenomenon is observed. For example, the thickness and/or conductivity of the n-GaN layer can be designed to provide a controlled amount of current crowding at high currents. In this regard, a graph of an expected current density through the p-n junction layer 520, as a function of lateral position along the p-n junction layer, is provided in the figure. Curve 530 is representative of a first electrical current applied across electrodes 514, 516, and curve 532 is representative of a second electrical current greater than the first current. The curves assume that the resistivity of the p-n junction layer 520 is lower for the second electrical current than for the first electrical current. Although both curves exhibit a plateau or maximum at positions corresponding to the top electrode 514, and taper off with increasing distance from that electrode, curve 532 is more heavily weighted or concentrated at positions close to the electrode, while curve 528 more nearly approximates a uniform spatial distribution. These differences in current density result in corresponding differences in the spatial distribution of pump light emitted from output surface 512$a$, which, in combination with the different spatial distributions of the first and second light modifying materials, result in different relative amounts of the light of spectrum S5 and light of spectrum S6 in the system optical output 528, thus producing changes in the color or color temperature of the output 528.

The composition of the first and second light modifying materials, and their respective layout or spatial distribution on the output surface 512$a$ (e.g., the size of the gap between the electrode 514 and the first light modifying material 524), may if desired be chosen to provide a system optical output having a nominally white light output that at low applied currents exhibits a particular color temperature, e.g., 2500K or 3000K, and which at higher applied currents exhibits a color temperature that increases. The increase in color temperature with increasing current may be designed to approximate the change in color temperature associated with an incandescent light source, for example.

Figure 6:
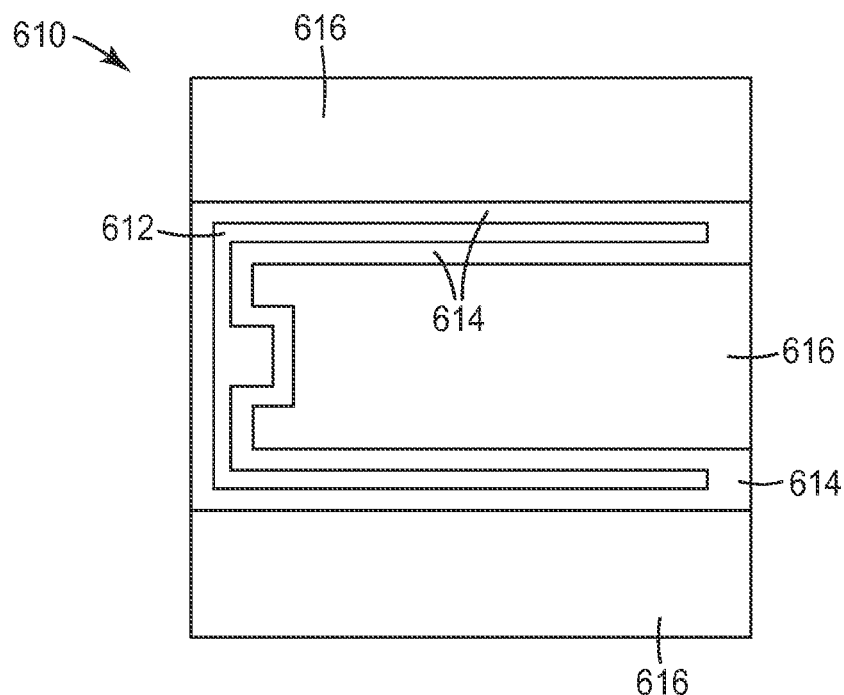
FIGS. 6 and 7 are schematic top views of different lighting systems.
Figure 7:
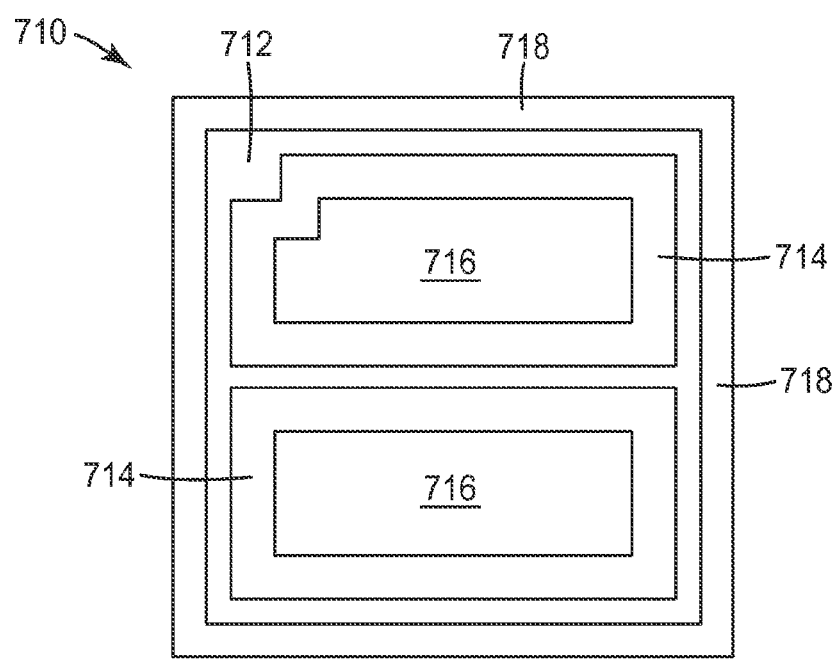

FIGS. 6 and 7 show schematic top views of other lighting systems capable of providing a system optical output whose color or color temperature changes as a function of an applied electrical signal. For brevity, details of the design of the electroluminescent device are not shown, but reference is made in that regard to the discussion above. Instead, FIGS. 6 and 7 illustrate alternative designs of the top electrode and spatial distributions of the first and second light modifying materials that can be used to produce the desired color-changing effects.

In FIG. 6, a lighting system 610 includes a top electrode 612 disposed as shown on an output surface of an electroluminescent device. A first light modifying material 614 is spatially arranged or disposed to be proximate the electrode 612. A second light modifying material 616 is spatially arranged or disposed to be spaced apart from the electrode 612. Current crowding may result in more light associated with the first light modifying material, relative to light associated with the second light modifying material, to be present in the system optical output as a magnitude of the electrical signal is increased.

In FIG. 7, a lighting system 710 includes a top electrode 712 disposed as shown on an output surface of an electroluminescent device. A first light modifying material 714 is spatially arranged or disposed to be proximate the electrode 712. A second light modifying material 716 is spatially arranged or disposed to be spaced apart from the electrode 712. A zone or area 718 of the output surface is not covered with any light modifying material, such that pump light generated in the electroluminescent device is emitted from this area without modification. Current crowding may result in more light associated with the first light modifying material, relative to light associated with the second light modifying material, to be present in the system optical output as a magnitude of the electrical signal is increased.

Figure 8:
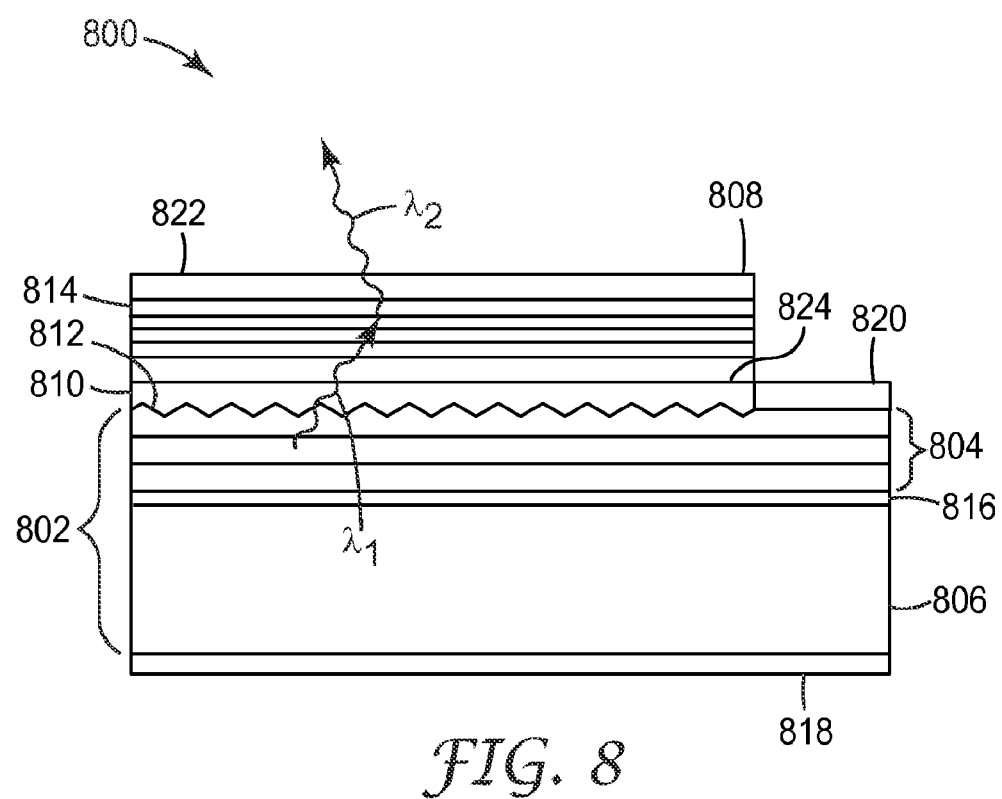
FIG. 8 is a schematic side view of a combination LED/RSC device.

FIG. 8 shows an illustrative device 800 that combines an RSC 808 and an LED 802. The LED has a stack of LED semiconductor layers 804, sometimes referred to as epilayers, on an LED substrate 806. The layers 804 may include p- and n-type junction layers, light emitting layers (typically containing quantum wells), buffer layers, and superstrate layers. The layers 804 may be attached to the LED substrate 806 via an optional bonding layer 816. The LED has an upper surface 812 and a lower surface, and the upper surface is textured to increase extraction of light from the LED compared to the case where the upper surface is flat. Electrodes 818, 820 may be provided on these upper and lower surfaces, as shown. When connected to a suitable power source through these electrodes, the LED emits light at a first wavelength $\lambda_1$, which may correspond to blue or ultraviolet (UV) light. Some of this LED light enters the RSC 808 and is absorbed there.

The RSC 808 is attached to the upper surface 812 of the LED via a bonding layer 810. The RSC has upper and lower surfaces 822, 824, with pump light from the LED entering through the lower surface 824. The RSC also includes a quantum well structure 814 engineered so that the band gap in portions of the structure is selected so that at least some of the pump light emitted by the LED 802 is absorbed. The charge carriers generated by absorption of the pump light diffuse into other portions of the structure having a smaller band gap, the quantum well layers, where the carriers recombine and generate light at the longer wavelength. This is depicted in FIG. 8 by the re-emitted light at the second wavelength $\lambda_2$ originating from within the RSC 808 and exiting the RSC to provide output light.

Figure 9:
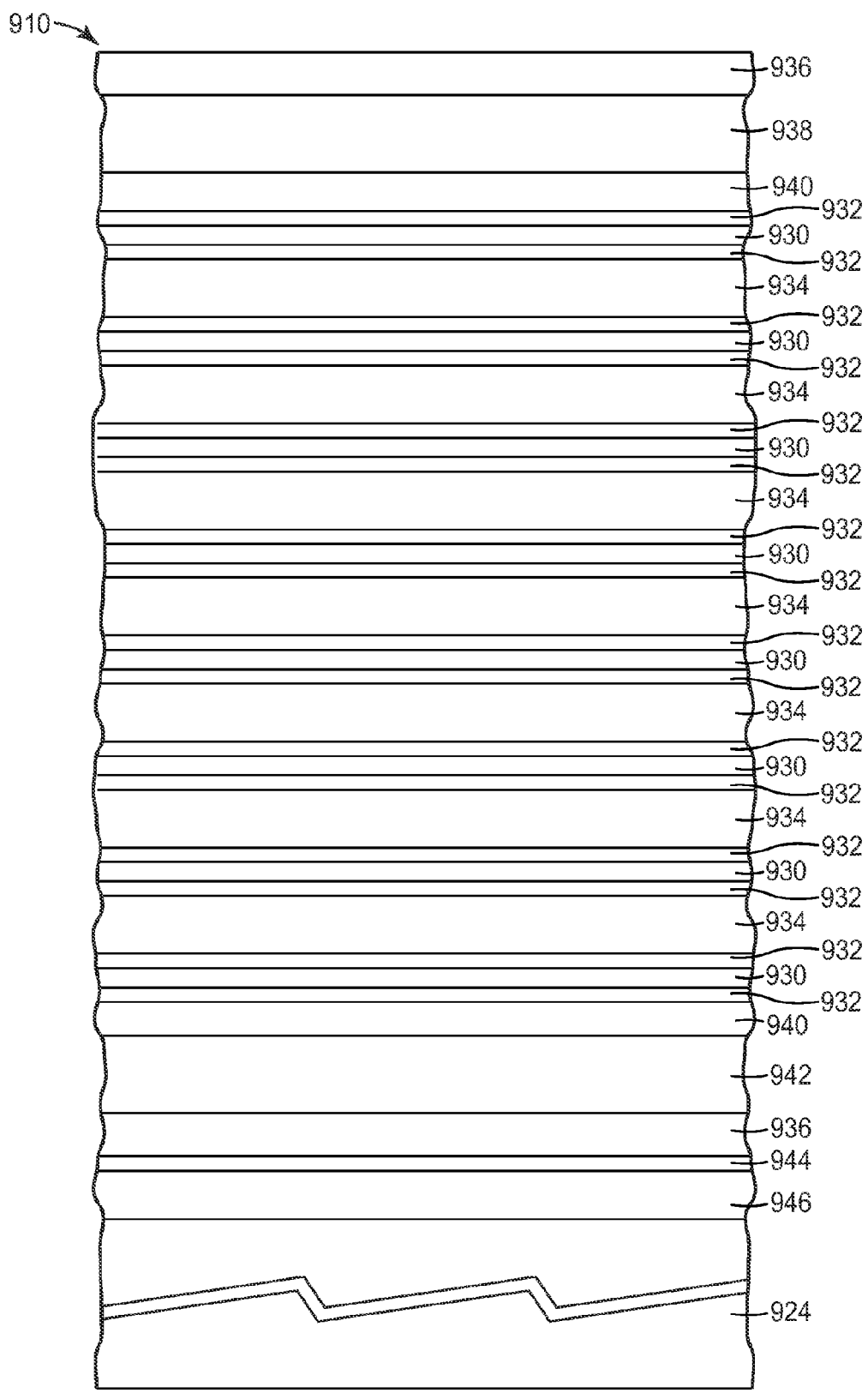
FIG. 9 is a schematic side view of an exemplary semiconductor layer stack that includes an RSC.

FIG. 9 shows an illustrative semiconductor layer stack 910 comprising an RSC. The stack was grown using molecular beam epitaxy (MBE) on an indium phosphide (InP) wafer. A GaInAs buffer layer was first grown by MBE on the InP substrate to prepare the surface for II-VI growth. The wafer was then moved through an ultra-high vacuum transfer system to another MBE chamber for growth of II-VI epitaxial layers used in the RSC. Details of the as-grown RSC are shown in FIG. 9 and summarized in Table 1. The table lists the thickness, material composition, band gap, and layer description for the different layers associated with the RSC. The RSC included eight CdZnSe quantum wells 930, each having a transition energy of 2.15 eV. Each quantum well 930 was sandwiched between CdMgZnSe absorber layers 932 having a band gap energy of 2.48 eV that could absorb blue light emitted by an LED. The RSC also included various window, buffer, and grading layers.

TABLE 1

| Reference No. | Material | Thickness (nm) | Band Gap/Transition (eV) | Comment |
|---|---|---|---|---|
| 930 | $Cd_{0.48}Zn_{0.52}Se$ | 3.1 | 2.15 | quantum well |
| 932 | $Cd_{0.38}Mg_{0.21}Zn_{0.41}Se$ | 8 | 2.48 | absorber |
| 934 | $Cd_{0.38}Mg_{0.21}Zn_{0.41}Se:Cl$ | 92 | 2.48 | absorber |
| 936 | $Cd_{0.22}Mg_{0.45}Zn_{0.33}Se$ | 100 | 2.93 | window |
| 938 | $Cd_{0.22}Mg_{0.45}Zn_{0.33}Se \rightarrow Cd_{0.38}Mg_{0.21}Zn_{0.41}Se$ | 250 | 2.93-2.48 | grading |
| 940 | $Cd_{0.38}Mg_{0.21}Zn_{0.41}Se:Cl$ | 46 | 2.48 | absorber |
| 942 | $Cd_{0.38}Mg_{0.21}Zn_{0.41}Se \rightarrow Cd_{0.22}Mg_{0.45}Zn_{0.33}Se$ | 250 | 2.48-2.93 | grading |
| 944 | $Cd_{0.39}Zn_{0.61}Se$ | 4.4 | 2.24 | II-VI buffer |
| 946 | $Ga_{0.47}In_{0.53}As$ | 190 | 0.77 | III-V buffer |
| 924 | InP | 350,000 | 1.35 | III-V substrate |

Further details of this and other RSC devices can be found in PCT Publication WO 2009/048704 (Kelley et al.).

An exemplary semiconductor stack comprising an RSC capable of simultaneously emitting light having a spectrum that includes two peak wavelengths, similar to the spectrum shown in FIG. 3b, is set forth below in Table 2. The stack includes one green-emitting (555 nm) quantum well, producing a green spectral peak, and one red-emitting (620 nm) quantum well, producing a red spectral peak. The relative intensities of the green and red peaks are principally controlled by the thicknesses of the absorber layers associated with the respective quantum wells. By using relatively thin absorber layers adjacent the green-emitting quantum well, more of the pump light will pass through these layers and be absorbed in the absorbing layers adjacent the red-emitting quantum well. This can result in the emission of more red light than green light. The ratio of green light to red light may also be somewhat influenced by the presence of any light-extraction features, e.g., where such features are etched into or attached to the outer surface of the cyan blocker.

TABLE 2

| Layer type | Material | Thickness (nm) | Band gap/ emission energy (eV) | Band gap/ emission wavelength (nm) |
|---|---|---|---|---|
| cyan blocker | $Cd_{0.38}Mg_{0.21}Zn_{0.41}Se$ | 1000 | 2.48 | 500 |
| barrier | $Cd_{0.23}Mg_{0.43}Zn_{0.34}Se$ | 20 | 2.88 | 430 |
| absorber | $Cd_{0.34}Mg_{0.27}Zn_{0.39}Se$ | 150 | 2.58 | 480 |
| quantum well | $Cd_{0.72}Zn_{0.28}Se$ | ~4 | 2.00 | 620 |
| absorber | $Cd_{0.34}Mg_{0.27}Zn_{0.39}Se$ | 150 | 2.58 | 480 |
| barrier | $Cd_{0.23}Mg_{0.43}Zn_{0.34}Se$ | 20 | 2.88 | 430 |
| absorber | $Cd_{0.34}Mg_{0.27}Zn_{0.39}Se$ | 30 | 2.58 | 480 |
| quantum well | $Cd_{0.47}Zn_{0.53}Se$ | ~3 | 2.23 | 555 |
| absorber | $Cd_{0.34}Mg_{0.27}Zn_{0.39}Se$ | 30 | 2.58 | 480 |
| window | $Cd_{0.23}Mg_{0.43}Zn_{0.34}Se$ | 500 | 2.88 | 430 |

The person skilled in the art will understand how to tailor the composition of the CdMgZnSe alloys to achieve the listed band gap energies for the various layers. For example, the band gap energies of the CdMgZnSe alloys are primarily controlled by the Mg content. Emission wavelengths (or energies) of the quantum wells are controlled both by the Cd/Zn ratio, and the precise thickness of the quantum well.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A lighting system, comprising:
   an electroluminescent device adapted to emit light in response to an applied electrical signal; and
   a first light modifying material adapted to modify a first portion of the emitted light to provide a first light component;
   wherein the lighting system combines the first light component with at least a second light component associated with a second portion of the emitted light to produce a system optical output;
   wherein the system optical output has a color temperature that changes based on the applied electrical signal; wherein the changes in color temperature are a result of substantial current crowding; wherein the emitted light is emitted from an output surface of the electroluminescent device, and wherein the electroluminescent device is characterized in that a spatial distribution of the emitted light over the output surface changes as a function of the applied electrical signal, the changes in the spatial distribution being at least in part as a result of the current crowding.

2. The system of claim 1, wherein the system optical output is characterized by a relative proportion of the first to the second light component, and wherein the changes in color temperature are associated with changes in the relative proportion.

3. The system of claim 1, wherein the emitted light has an emitted light spectrum and the first light component has a first spectrum different from the emitted light spectrum.

4. The system of claim 3, further comprising a second light modifying material that modifies the second portion of the emitted light to provide the second light component, the second light component having a second spectrum different from the first spectrum and from the emitted light spectrum.

5. The system of claim 4, wherein the first light modifying material covers a first portion of the output surface and the second light modifying material covers a second portion of the output surface.

6. The system of claim 5, further comprising a third light modifying material covering a third portion of the output surface, the third light modifying material being adapted to modify a third portion of the emitted light to provide a third light component that has a third spectrum different from the first, second, and emitted light spectra.

7. The system of claim 3, wherein the first light modifying material covers a first portion of the output surface, wherein a second portion of the output surface is characterized by an absence of any light modifying material, and wherein the second light component has a second spectrum that is substantially the same as the emitted light spectrum.

8. The system of claim 3, wherein the emitted light spectrum has a peak at a wavelength $\lambda_p$ and the first spectrum has a peak at a wavelength $\lambda_1$, and wherein $\lambda_1 > \lambda_p$.

9. The system of claim 1, wherein the first light modifying material comprises a phosphor.

10. The system of claim 1, wherein the first light modifying material comprises a first re-emitting semiconductor construction that includes a first potential well.

11. The system of claim 10, further comprising a second light modifying material that modifies the second portion of the emitted light to provide the second light component, the second light modifying material comprising a second re-emitting semiconductor construction that includes a second potential well.

12. The system of claim 5, wherein the electroluminescent device includes an electrical contact disposed on the output surface, wherein the first portion of the output surface is disposed proximate the electrical contact, and wherein the second portion of the output surface is spaced apart from the electrical contact.

13. The system of claim 1, wherein the color temperature changes as a function of a magnitude of the applied electrical signal.

14. The system of claim 13, wherein the color temperature increases with increasing magnitude of the applied electrical signal.

15. A lighting system, comprising:
   an electroluminescent device adapted to emit light from an output surface in response to an applied electrical current, the electroluminescent device being characterized in that a spatial distribution of the emitted light over the output surface substantially changes as a function of the electrical current as a result of substantial current crowding; and a first light converting material covering a first portion of the output surface and adapted to convert a first portion of the emitted light to a first light component;

wherein the first light component combines with at least a second light component to provide a system optical output, the second light component being associated with a second portion of the emitted light; and wherein the first light converting material is spatially distributed such that the changes in the spatial distribution of the emitted light over the output surface produce changes in a color of the system optical output.

16. The system of claim 15, wherein the second light component is not associated with any light converting material.

17. The system of claim 15, further comprising a second light converting material covering a second portion of the output surface, the second light converting material being adapted to convert the second portion of the emitted light to the second light component.

18. The system of claim 15, wherein the electroluminescent device includes an electrical contact disposed on the output surface, wherein the first portion of the output surface is generally proximate the electrical contact, and wherein the output surface includes a second portion generally spaced apart from the electrical contact.

19. The system of claim 15, wherein the system optical output comprises white light, and wherein the changes in the color comprise changes in a color temperature of the system optical output.

* * * * *

UNITED STATES PATENT AND TRADEMARK OFFICE
CERTIFICATE OF CORRECTION

PATENT NO. : 8,304,976 B2
APPLICATION NO. : 13/379933
DATED : November 6, 2012
INVENTOR(S) : Michael A Haase Page 1 of 1

It is certified that error appears in the above-identified patent and that said Letters Patent is hereby corrected as shown below:

Column 7
Line 39, delete "λ2" and insert -- $\lambda_2$ --, therefor.
Line 61, delete "minors," and insert -- mirrors, --, therefor.

Column 10
Line 5, delete "51" and insert -- S1 --, therefor.

Signed and Sealed this
Nineteenth Day of February, 2013

Teresa Stanek Rea
*Acting Director of the United States Patent and Trademark Office*